United States Patent
Inoue

[11] Patent Number: 6,136,699
[45] Date of Patent: Oct. 24, 2000

[54] METHOD OF MANUFACTURING SEMICONDUCTOR DEVICE USING PHASE TRANSITION

[75] Inventor: Ken Inoue, Tokyo, Japan

[73] Assignee: NEC Corporation, Tokyo, Japan

[21] Appl. No.: 09/164,494

[22] Filed: Oct. 1, 1998

[30] Foreign Application Priority Data

Oct. 7, 1997 [JP] Japan ................................. 9-274710

[51] Int. Cl.$^7$ .................................................. H01L 21/44
[52] U.S. Cl. ........................ 438/656; 438/653; 438/655; 438/660; 438/683
[58] Field of Search ................................. 438/656, 653, 438/655, 660, 683

[56] References Cited

U.S. PATENT DOCUMENTS

| | | | |
|---|---|---|---|
| 4,398,341 | 8/1983 | Geipel, Jr. et al. | 29/278 |
| 4,470,189 | 9/1984 | Roberts et al. | 29/571 |
| 5,384,285 | 1/1995 | Sitaram et al. | 438/664 |
| 5,621,232 | 4/1997 | Ohno | 257/288 |

FOREIGN PATENT DOCUMENTS

| | | |
|---|---|---|
| 2-45923 | 2/1990 | Japan . |
| 7-86559 | 3/1995 | Japan . |

OTHER PUBLICATIONS

Wei, Chih–Shih et al., Formation of Self–Aligned Tin/CoSi$_2$ Bilayer from Co/Ti/Si and Its Applications in Salicide, Diffusion Barrier and Contact Fill, 1990 IEEE, VMIC Conference, pp. 233–239.

Ogawa, Shinichi et al., "Epitaxial CoSi$_2$ Film Formation on (100) Si by Annealing of Co/Ti/Si Structure in N$_2$ ", 1993 Spring MRS Meeting, San Francisco, pp. 4–10.

J.W. Mayer and S.S. Lau, Electronic Materials Science: For Integrated Circuits in Si and GaAs, (Macmillan, New York, 1990), chp. 11.

S. Wolf and R.N. Tauber, Silicon Processing for the VLSI Era, vol. 1—Process Technology, (Lattice Press, Sunset Beach, CA, 1986).

*Primary Examiner*—Richard Elms
*Assistant Examiner*—Christian D. Wilson
*Attorney, Agent, or Firm*—Hutchins, Wheeler & Dittmar

[57] ABSTRACT

In manufacturing a semiconductor device, a refractory metal silicide layer having a first phase structure is formed. In this case, the refractory metal silicide layer having the first phase structure may be formed during performing a deposition operation of a refractory metal, in a state in which a semiconductor substrate is heated. Instead, a refractory metal film may be first deposited in a vacuum state, and then a semiconductor substrate may be heated in the vacuum state to change the refractory metal film into said refractory metal silicide layer having a first phase structure. After the refractory metal silicide layer having the first phase structure is formed, heat treatment is performed to change said refractory metal silicide layer having said first phase structure into a refractory metal silicide layer having a second phase structure.

22 Claims, 8 Drawing Sheets

METHOD OF MANUFACTURING SEMICONDUCTOR DEVICE USING PHASE TRANSITION

BACKGROUND OF THE INVENTION

1. Field of the Invention

The present invention relates to a method of manufacturing a semiconductor device, and more particularly to a method of forming a silicide layer on the surface of a gate electrode or the surface of a source or drain diffusion layer of an insulating gate type field effect transistor (a MOS transistor).

2. Description of the Related Art

The development of a semiconductor device with a fine pattern size and a high density is still carried dynamically. At present, very highly integrated semiconductor devices such as a memory device and a logic device have been developed based on the design rule of 0.15 to 0.25 $\mu$m. With the high integration of the semiconductor device, it becomes very important to reduce the gate electrode width and diffusion layer width and to reduce the film thickness of each of the components of the semiconductor device.

When a diffusion layer is formed to have a shallow junction, a parasitic resistance of the MOS transistor increases to decrease the drive capability of the MOS transistor. Also, the reduction of the wiring width or film thickness of the gate electrode necessarily increase the wiring resistance to largely influence to the delay of the circuit operation.

Therefore, in the semiconductor device with fine patterns, the technique to form high melting point or refractory metal silicide on the surface of the diffusion layer or the surface of the gate electrode becomes important. Especially, in the silicide layer forming technique or the salicide layer forming technique, high melting point metals such as cobalt becomes essential to the MOS transistor with fine patterns. In this case, because it is difficult to keep the resistance value of the silicide layer constant, various methods are studied and proposed. For example, in case of the formation of a silicide layer of cobalt, it is especially difficult to control the heat reaction of cobalt with silicon.

A conventional method of forming a silicide layer of cobalt is described in Japanese Laid Open Patent Application (JP-A-Heisei 2-45923: hereinafter, to be referred to as a first conventional example). Or, the method described in Japanese Laid Open Patent Application (JP-A-Heisei 7-86559: hereinafter, to be referred to as a second conventional example) is known.

The first conventional example will be described with reference to FIGS. 1A to 1C. FIGS. 1A to 1C show the salicide forming process of cobalt.

As shown in FIG. 1A, an N well 102 is formed in a P-type silicon substrate 101 by a well known method. Subsequently, a field oxide film 103 is formed on the surface of the P-type silicon substrate 101 by a selective oxidation method. A gate oxide film 104 such as a silicon oxide film and a polysilicon film are formed in order in an active region which is surrounded by the field oxide film 103. Phosphorus ions as impurities are doped in the polysilicon film by a well known technique. Thus, the resistance value of the polysilicon film is reduced.

Next, the above-mentioned polysilicon film is patterned by a well known photolithography method and the dry etching method so that a gate electrode 105 is formed. Then, an N-type impurity diffusion layer 107 with a low concentration and a P-type impurity diffusion layer 108 with a low concentration are formed by the photolithography method and the ion implantation method. Subsequently, side wall spacers 106 composed of a silicon oxide film or a silicon nitride film are formed on the side walls of the gate electrode 105 using a well known chemical vapor deposition (CVD) method and the dry etching method.

Next, as shown in FIG. 1B, a P-type impurity diffusion layer with a high concentration and an N-type impurity diffusion layer with a high concentration are formed by the photolithography method and the ion implantation method. Thus, the N-type source and drain diffusion layers 109 and the P-type source and drain diffusion layers 110 are formed to have a LDD (Lightly Doped Drain) structure. Subsequently, native oxide films (not shown) on the surface of the polysilicon film as the gate electrode and on the surface of the silicon substrate are removed and a cobalt film 111 is sputtered without heating the silicon substrate. Then, the silicon substrate is heated to the temperature at which a $CoSi_2$ film 112 is formed, in a vacuum apparatus without exposing the surface of the silicon substrate to the atmosphere. In this case, the heating temperature is in a range from 500° C. to 800° C.

Next, as shown in FIG. 1C, a wet etching is performed by the mixture solution of a sulfuric acid solution and a hydrogen peroxide solution to selectively remove non-reacting portions of the cobalt film 111 which exist on the field oxide film 103 and the side wall spacers 106. Thus, the $CoSi_2$ film 112 is selectively formed on the surface of the gate electrode 105, on the surfaces of the N-type source and drain diffusion layers 109 and on the surfaces of the P-type source and drain diffusion layers 110 of the MOS transistor without forming any cobalt silicide layer on the surfaces of the insulating films, i.e., the field oxide film 103 and the side wall spacers 106.

Next, the second conventional example will be described with reference to FIGS. 2A to 2C. FIGS. 2A to 2C shown the salicide forming process using a metal film such as a cobalt film.

As shown in FIG. 2A, an element separation region 202 is formed on the surface of a silicon substrate 201. Subsequently, a gate oxide film 203 such as a silicon oxide film and a polysilicon film is grown in order in the active region which is surrounded by the element separation region 202. Then, phosphorus ions as impurities are doped in the polysilicon film by the known technique. Thus, the resistance value of the polysilicon film is reduced. Subsequently, the above-mentioned polysilicon film is patterned by a well known photolithography method and the dry etching method such that a polysilicon gate 204 is formed. Subsequently, side wall spacers 205 are formed on the side walls of the polysilicon gate 204 by a well known method.

Next, a cobalt film 206 and a titanium film 207 are continuously deposited on the whole surface by a sputtering method. In this case, the film thickness of each of the metal films is set to about 10 nm. Subsequently, a heat treatment like a rapid thermal annealing (RTA) method is performed at about 700° C. in the nitrogen ambience. Thus, as shown in FIG. 2B, a cobalt silicide film 208 is formed on the surface of the silicon substrate 201 and the surface of the polysilicon gate 204. At this time, the cobalt film 206 on the silicon oxide film of the element separation region 202 and the side wall spacers 205 is not silicided and remained in the non-silicided state. Also, the whole of titanium film 207 is changed into a titanium nitride film 209 through the above-mentioned heat treatment. Subsequently, a wet etching is selectively performed to the above-mentioned non-silicided cobalt film 206 and the titanium nitride film 209. Thus, as shown in FIG. 2C, a cobalt silicide film 208 is selectively formed in the gate, source and drain area of the MOS transistor formed on the silicon substrate 201.

However, in the above-mentioned first conventional example, the reaction of cobalt with silicon occurs to form a $CoSi_x$ film in the temperature at which a $CoSi_2$ film is formed, on the insulating films such as the field oxide film 103 and the side wall spacers 106. When the $CoSi_x$ film is once formed in this way, it is difficult to remove the $CoSi_x$ film by a wet etching method. For example, when the $CoSi_x$ film formed on the insulating film is etched, using a mixture solution of a hydrochloric acid solution and a hydrogen peroxide solution, the $CoSi_2$ film formed on the gate or diffusion layer is also etched. For this reason, the resistance values of the source and drain diffusion layers and gate electrode, specifically the sheet resistance values of them increase in the formation of a MOS transistor with fine patterns.

Also, the film thickness control of the cobalt silicide layer formed thus is difficult. As a result, it is difficult to decrease the deviation of sheet resistance values of the gate electrodes and source and drain diffusion layers of the MOS transistors in a semiconductor chip or a semiconductor wafer where the semiconductor device is formed. For this reason, the deviation of characteristics of the MOS transistors increases.

Also, in the above-mentioned second conventional example, the cobalt film 206 and the titanium film 207 are deposited by the sputtering method. Depending on the condition of the heat treatment, there is a case that a mixed crystal silicide film of cobalt and titanium is formed through the heat reaction of the cobalt film and the titanium film. As a result, the number of silicide processes increases and the manufacturing process become complicated.

Also, in this case, it is also difficult to control the film thickness of the cobalt silicide layer. For this reason, as described above, the deviation of characteristics of the MOS transistor in the semiconductor chip or the semiconductor wafer increases.

With the miniaturization and high integration of the MOS transistors, the minimum pattern size of the gate electrode and source and drain diffusion layers becomes equal to or less than 0.5 $\mu$m. In this case, the sheet resistance value of the gate electrode or diffusion layer becomes high, compared with the sheet resistance value of the $CoSi_2$ film when the gate electrode width or the diffusion layer width is wide. That is, the resistance value of the completed silicide layer has the pattern size dependency. As a result, the design of the MOS transistor or the semiconductor device becomes difficult.

SUMMARY OF THE INVENTION

The present invention is accomplished to solve the above problems. Therefore, an object of the present invention is to provide a method of manufacturing a semiconductor device, in which the resistance value of a gate electrode or a diffusion layer can be made small in the semiconductor device with a fine pattern structure.

Also, another object of the present invention is to provide a method of manufacturing a semiconductor device, in which the heat reaction of high melting point metal such as cobalt with an insulating film can be suppressed, so that a $CoSi_2$ film can be selectively formed on the gate electrode and/or diffusion layer.

Still another object of the present invention is to provide a method of manufacturing a semiconductor device, in which a silicide layer of high quality can be formed, even if the silicide layer width becomes as small as about 0.1 $\mu$m.

Yet still another object of the present invention is to provide a method of manufacturing a semiconductor device, in which a silicide layer can be formed in a simple process in a MOS transistor manufacturing process, so that the silicide forming process can be stabilized and a manufacturing cost can be reduced.

In order to achieve an aspect of the present invention, in a method of manufacturing a semiconductor device, a refractory metal silicide layer having a first phase structure is formed, and then heat treatment is performed to change the refractory metal silicide layer having the first phase structure into a refractory metal silicide layer having a second phase structure.

In order to form the refractory metal silicide layer having the first phase structure, the refractory metal silicide layer having the first phase structure during performing a deposition operation of a refractory metal, in a state in which a semiconductor substrate is heated. In this case, it is desirable that a deposition rate of the refractory metal is smaller than a phase transition rate of the refractory metal into a refractory metal silicide. More specifically, it is desirable that the deposition rate of the refractory metal is in a range of 0.05 nm/sec. to 0.3 nm/sec.

Also, in order to form the refractory metal silicide layer having the first phase structure, a refractory metal film may be deposited in a vacuum state. Then, a semiconductor substrate may be heated in the vacuum state to change the refractory metal film into the refractory metal silicide layer having a first phase structure.

Further, in order to form the refractory metal silicide layer having the first phase structure, a barrier film may be formed on a silicon containing layer of a semiconductor substrate. The barrier film functions to allow atoms of a refractory metal to pass through the barrier film and to inhibit silicon atoms in the silicon containing layer from passing through the barrier film. Then, the semiconductor substrate is heated to form the refractory metal silicide layer having the first phase structure from the atoms of the refractory metal deposited on the barrier film and the silicon atoms in the silicon containing layer. In this case, it is desirable that the barrier film is a porous silicon oxide film. Also, it is desirable that the refractory metal is deposited on the barrier film while the semiconductor substrate is heated to a temperature in a range of 400 to 500 ° C.

The method may further include the step of rinsing a semiconductor substrate to remove a non-silicided portion of a refractory metal. In this case, the semiconductor substrate is rinsed with a mixture solution of a sulfuric acid solution and a hydrogen peroxide solution to remove the non-silicided portion of the refractory metal.

In the method, the heat treatment may be performed such that the refractory metal silicide layer having the first phase structure is changed into a refractory metal silicide layer having a third phase structure, and then the refractory metal silicide layer having the third phase structure is changed into a refractory metal silicide layer having the second phase structure. In this case, the refractory metal desirably is one of cobalt and nickel. Also, it is desirable that the refractory metal silicide layer having the first phase structure is a $Co_2Si$ film, the refractory metal silicide layer having the third phase structure is a $CoSi$ film, and the refractory metal silicide layer having the second phase structure is a $CoSi_2$ film. In this case, the $CoSi_2$ film as the refractory metal silicide layer having the second phase structure is epitaxially grown.

In order to achieve another aspect of the present invention, a method of manufacturing a semiconductor device, includes the steps of:

depositing a refractory metal in a state in which a semiconductor substrate is heated;

forming the refractory metal silicide layer having the first phase structure during performing the deposition operation;

controlling a quantity of the refractory metal to be deposited such that the refractory metal silicide layer having the first phase structure has a predetermined film thickness; and performing heat treatment to change the refractory metal silicide layer having the first phase structure into a refractory metal silicide layer having a second phase structure.

Further, in order to achieve still another aspect of the present invention, a method of manufacturing a semiconductor device, includes the steps of:

forming a barrier film on a silicon containing layer of a semiconductor substrate, the barrier film functioning to allow atoms of a refractory metal to pass through the barrier film and to inhibit silicon atoms in the silicon containing layer from passing through the barrier film;

heating the semiconductor substrate to form the refractory metal silicide layer having the first phase structure from the atoms of the refractory metal deposited on the barrier film and the silicon atoms in the silicon containing layer;

rinsing the semiconductor substrate to remove a non-silicided portion of the refractory metal; and performing heat treatment to change the refractory metal silicide layer having the first phase structure into a refractory metal silicide layer having a second phase structure.

The heat treatment is performed such that the refractory metal silicide layer having the first phase structure is changed into a refractory metal silicide layer having a third phase structure, and then the refractory metal silicide layer having the third phase structure is changed into a refractory metal silicide layer having the second phase structure. The refractory metal silicide layer having the first phase structure is a $Co_2Si$ film, the refractory metal silicide layer having the third phase structure is a CoSi film, and the refractory metal silicide layer having the second phase structure is a $CoSi_2$ film. In this case, the $CoSi_2$ film as the refractory metal silicide layer having the second phase structure is epitaxially grown.

DESCRIPTION OF THE PREFERRED EMBODIMENTS

Next, a method of forming a silicide layer of the present invention will be described with reference to the attached drawings.

FIGS. 3A to 3E are cross sectional views of a MOS transistor when a cobalt silicide layer is formed in accordance with the manufacturing method according to the first embodiment of the present invention.

Figure 1A:
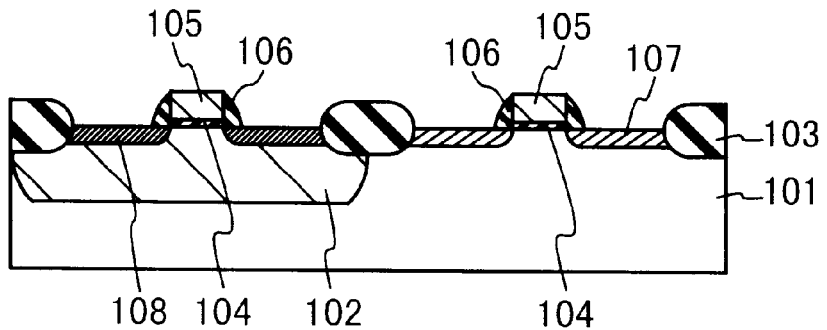
FIGS. 1A to 1C are cross sectional views of a semiconductor device with a silicide layer in a first conventional example in the forming process order.
Figure 1B:
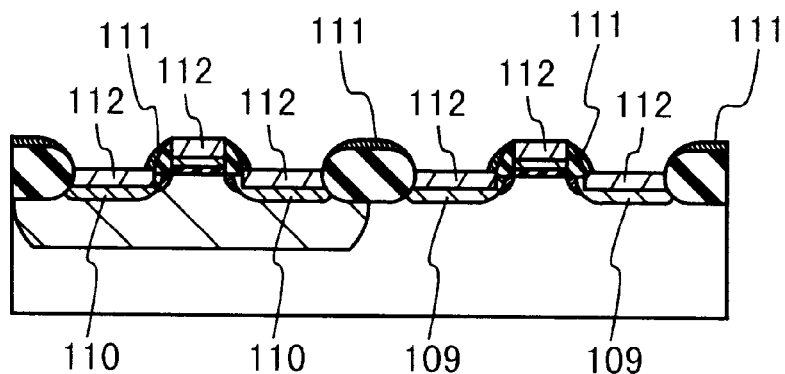
Figure 1C:
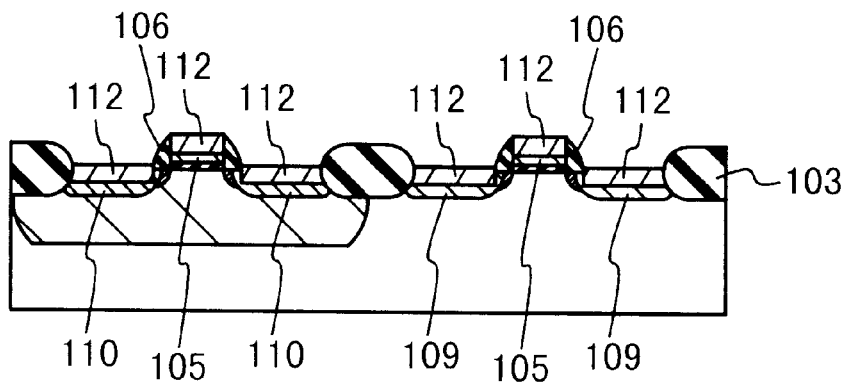
Figure 2A:
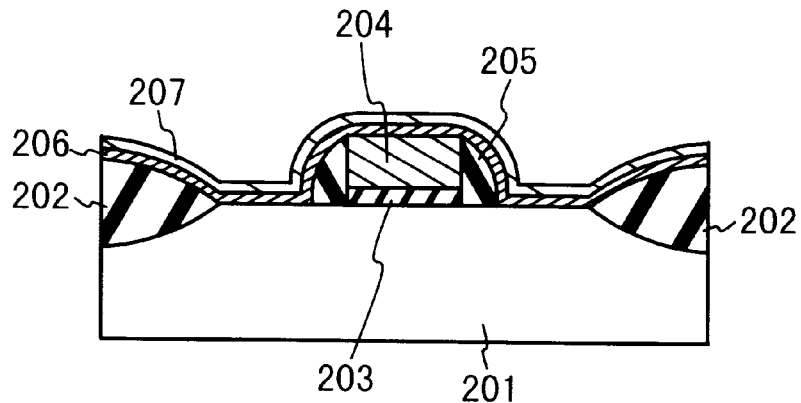
FIGS. 2A to 2C are cross sectional views of a semiconductor device with a silicide layer in a second conventional example in the forming process order.
Figure 2B:
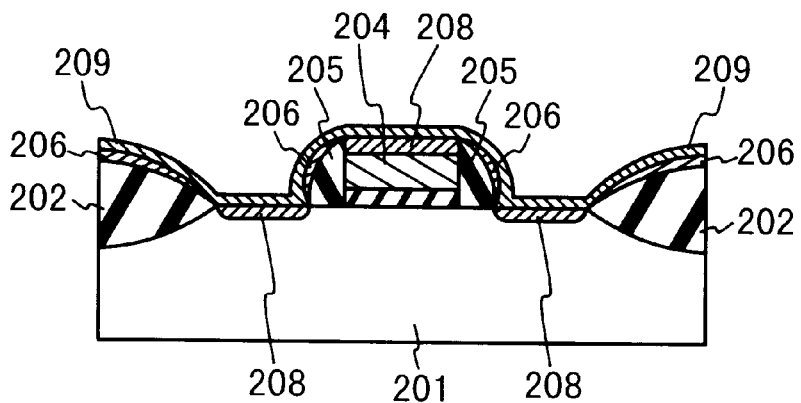
Figure 2C:
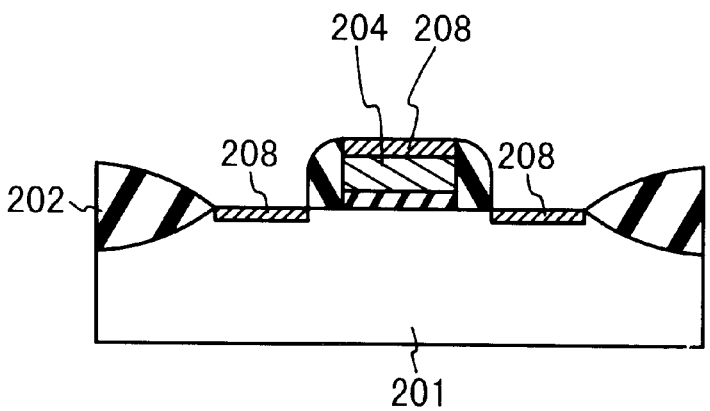
Figure 3A:
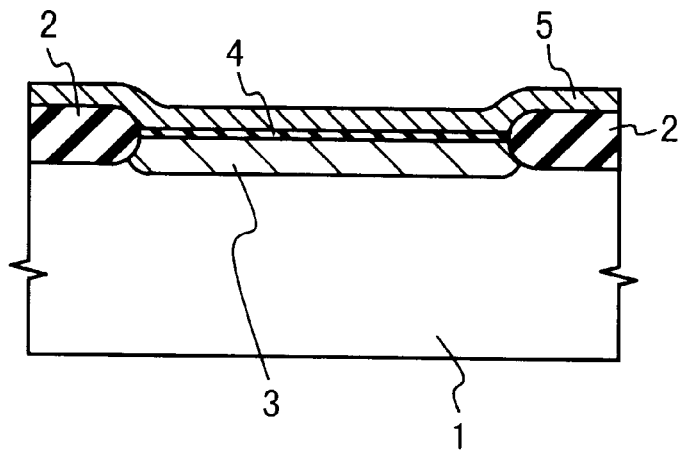
FIGS. 3A to 3E are cross sectional views of a semiconductor device with a silicide layer in a method of forming the silicide layer according to the first embodiment of the present invention in the forming process order.
Figure 3B:
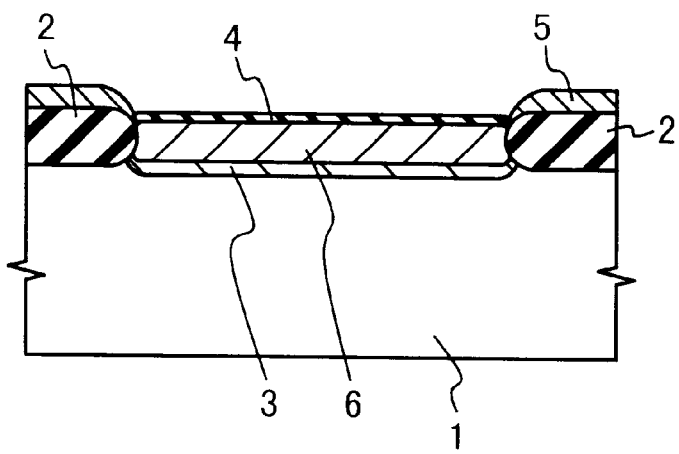

As shown in FIG. 3A, an element separation insulating film 2 is selectively formed on the surface of a P-type silicon substrate 1. In this case, the element separation insulating film 2 is formed by a usual LOCOS method or a trench element separation method. Then, a diffusion layer 3 for a source and drain region of the MOS transistor is formed on the surface of the silicon substrate 1 in the area where the element separation insulating film 2 is not formed. In this case, the diffusion layer 3 is an N-type diffusion layer which contains arsenic ions as impurities.

Next, a native oxide film on the diffusion layer 3 is removed with a chemical solution such as a diluted fluoric acid solution. A barrier film 4 is formed on the diffusion layer 3. The barrier film 4 functions to prevent the diffusion of silicon atoms, to be mentioned later. The barrier film 4 has the film thickness of about 1 nm and is composed of a porous silicon oxide film. Such a porous silicon oxide film can be formed by heating the silicon substrate 1 in a nitric acid solution. Instead, it is possible to form the porous silicon oxide film by heating the silicon substrate 1 in the mixture solution of an ammonia solution and a hydrogen peroxide solution.

After the barrier film 4 is formed on the surface of the silicon substrate 1, a cobalt film 5 is formed by a sputtering method in a multi-chamber apparatus which is composed of a multiple chambers. The multi-chamber apparatus can be set to the high vacuum state of about $10^{-9}$ Torr. The film formation by the sputtering method is performed at the high temperature of about 450° C. The film thickness of the cobalt film 5 is set to about 10 nm. Also, the sputtering film forming rate is set to be about 0.5 nm/sec.

In the sputtering at such a temperature, only a part of the surface of the diffusion layer 3 is silicided. In the silicidation, a $Co_2Si$ film is formed. The cobalt atoms of the cobalt film 5 moves to the surface of the silicon substrate 1 through the barrier film 4. However, the silicon atoms in the surface of the silicon substrate 1 do not diffuse to the cobalt film 5. This is because the barrier film 4 is formed to prevent the diffusion of the silicon atoms. It should be noted that the temperature of the film formation by the sputtering method is very effective in a range of 400 to 500° C.

Next, the silicon substrate 1 is transferred to another chamber of the above-mentioned multi-chamber apparatus in the vacuum state and heat treatment is performed in the high vacuum of about $10^{-9}$ Torr. The cobalt film is very easy to be oxidized, and the oxidation prevents the silicidation of cobalt. However, because the silicon substrate is transferred in the vacuum state in the present invention without being exposed to the atmosphere, there is not such a problem.

In this case, the heat treatment temperature is set to about 450° C., and the heat treatment time is about 30 sec. The heat treatment allows the cobalt atoms of the whole of cobalt film 5 to diffuse into the surface of the diffusion layers 3 through the barrier film 4 to completely form a $Co_2Si$ film 6 on the surface of the diffusion layers 3. The $Co_2Si$ film 6 is the high melting point metal silicide layer of the first phase structure. The silicide layer has an orthorhombic system polycrystalline structure. It should be noted that the movement of the silicon atoms from the surface of the diffusion layer 3 to the cobalt film 5 is inhibited by the barrier film 4 during the heat treatment. For this reason, any $Co_2Si$ film 6 is not formed at all on the barrier film 4 or the element separation insulating film 2.

Figure 3C:
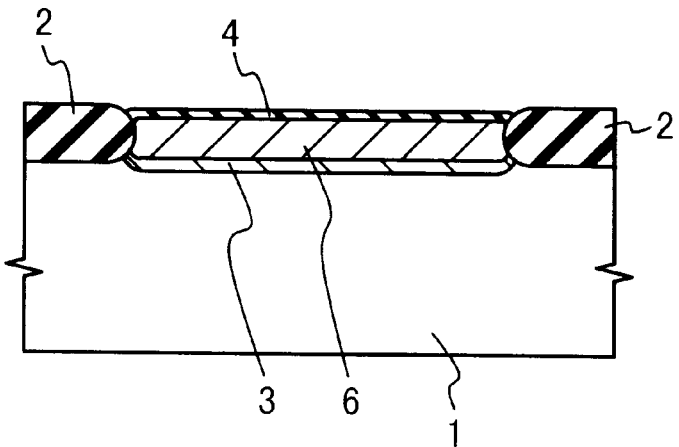
Figure 3D:
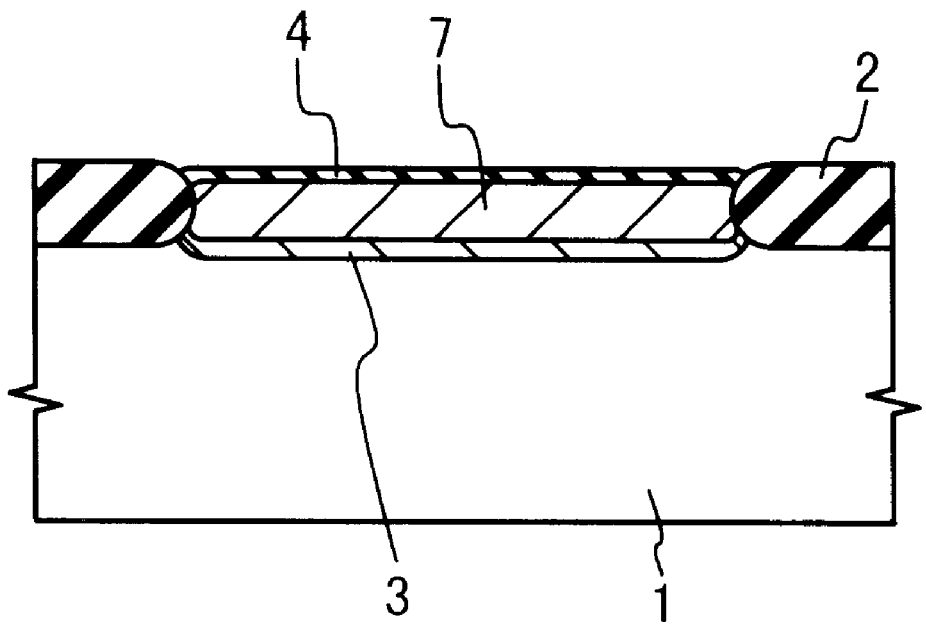

Next, the silicon substrate 1 is soaked in the mixture solution of a sulfuric acid solution and a hydrogen peroxide solution for a predetermined time so that the cobalt film 5 on the element separation insulating film 2 is selectively etched. In this way, as shown in FIG. 3C, the $Co_2Si$ film 6 is formed only on the diffusion layer 3 which has been formed on the surface of the silicon substrate 1. Any $Co_2Si$ film 6 is completely not formed on the element separation insulating film 2 as the insulating film. Also, the barrier film 4 remains on the $Co_2Si$ film 6 which is provided on the diffusion layer 3.

Next, the silicon substrate is rinsed with the mixture solution of a hydrochloric acid solution and a hydrogen peroxide solution and the mixture solution of an ammonia solution and a hydrogen peroxide solution. In this case, the barrier film 4 prevents the $Co_2Si$ film 6 from being corroded with the above-mentioned mixture solution. Generally, the $Co_2Si$ film is etched with the mixture solution of a hydrochloric acid solution and a hydrogen peroxide solution.

Next, the first RTA sintering is performed in the nitrogen ambience. The condition of the first sintering is the temperature of 600° C. and the processing time of about 60 sec.

Figure 3E:
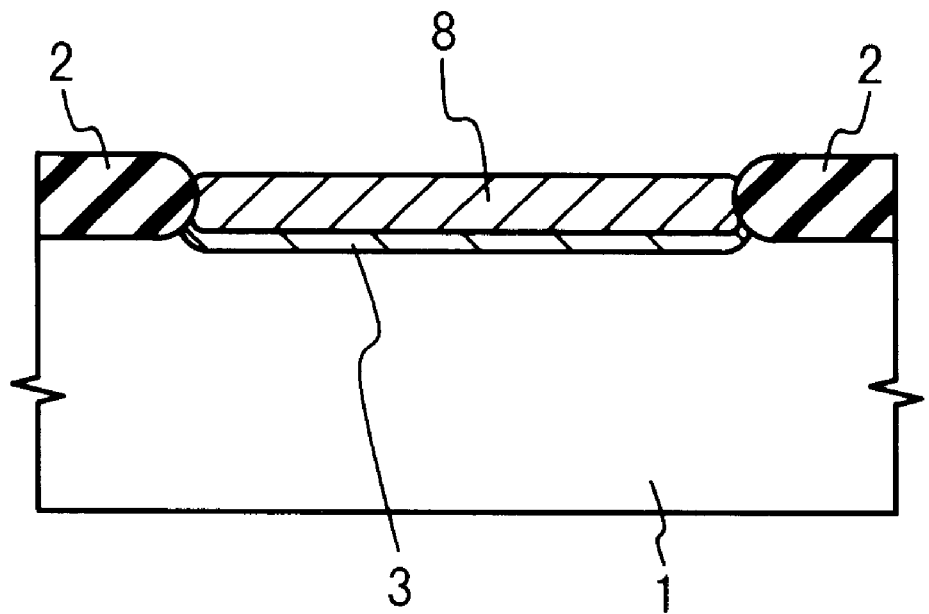

As shown in FIG. 3E, the phase transition from the $Co_2Si$ film 6 into a CoSi film 7 is performed. In this way, the CoSi film 7 is formed on the surface of the diffusion layer 3. The CoSi film 7 is the high melting point (refractory) metal silicide layer of the second phase structure. The silicide layer has a cubic system polycrystalline structure.

Next, once again, a second RTA sintering is performed in the nitrogen ambience. The condition of the second sintering is the temperature of 800° C. and the processing time of about 10 sec.

As shown in FIG. 3F, the phase transition from the CoSi film 7 into a $CoSi_2$ film 8 is performed for this time. The $CoSi_2$ film 8 is the high melting point (refractory) metal silicide layer of the third phase structure. The silicide layer is formed by the epitaxial growth and has the cubic system single crystalline structure. It should be noted that the lattice constant of the $CoSi_2$ crystal is very near to that of the silicon crystal. Thereafter, the barrier film 4 is removed by a wet etching method.

As described above, in this method, finally, the $CoSi_2$ film is selectively formed on the surface of the diffusion layer 3 on the silicon substrate 1. Any $CoSi_2$ film 8 is not formed at all on the element separation insulating film 2. Also, since the $CoSi_2$ film 8 is formed by the epitaxial growth in this method, the $CoSi_2$ film is a low resistance layer.

In the first embodiment, the barrier film 4 is formed as the porous silicon oxide film. As such a barrier film, the silicon nitride film having the film thickness of about 0.5 nm may be used. Instead, the barrier film 4 may be formed of not only the insulating film but also a metal film. What is important is that the barrier film 4 has the property to pass the cobalt atoms and not to pass the silicon atoms at the temperature at which the $Co_2Si$ film 6 is formed.

In the silicide forming method of the first embodiment, the barrier film is formed on the material surface to be silicided such as the silicon substrate, and the cobalt film is formed on the barrier film. The $Co_2Si$ film is formed and the sintering is performed, as described above. Finally, the $CoSi_2$ film is epitaxially grown and a silicide layer is selectively formed only in the diffusion layer surface.

In such a method, the whole of the cobalt film on the material surface to be silicided is changed into the cobalt silicide layer. For this reason, the final film thickness of the $CoSi_2$ film depends on the film thickness of the cobalt film formed by the sputtering process. Therefore, the film thickness control of the cobalt silicide layer becomes very easy. The deviation of sheet resistance of the gate electrode and the source and drain diffusion layers in the MOS transistor can be easily reduced in the semiconductor chip or semiconductor wafer in which the semiconductor device is formed. Further, the deviation of characteristics of the MOS transistors can be reduced.

Further, in this method, the cobalt silicide layer is formed by the epitaxial growth. Thus, there is a case that the minimum pattern size of the gate electrode and source and drain diffusion layers pattern becomes small with the miniaturization and high integration of the MOS transistors. In this case, the cobalt silicide layer formed in the area with a narrow pattern width can be formed to have the same film thickness as that of the cobalt silicide layer formed in the area with a wide pattern width. That is, the resistance value of the completed cobalt silicide layer does not have the pattern size dependency. Therefore, the design of the MOS transistor or the semiconductor device becomes very easy.

Also, the above-mentioned barrier film 6 has a function to prevent the $Co_2Si$ film from being etched in the acid rinse process. Also, the cobalt silicide layer which is formed in the epitaxial growth improves the endurance to the heat treatment. That is, the cobalt silicide layer gets to have a high heat resistance, so that agglomeration generated in usual case is never generated in this method. For these reasons, the process of forming the silicide layer in the manufacturing process of the MOS transistor can be made easy and stable so that the manufacturing cost can be reduced.

Figure 4A:
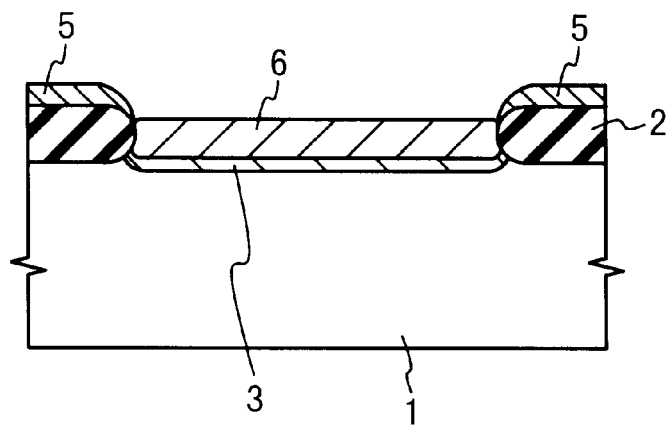
FIGS. 4A to 4C are cross sectional views of a semiconductor device with a silicide layer in a method of forming the silicide layer according to the second embodiment of the present invention in the forming process order.
Figure 4B:
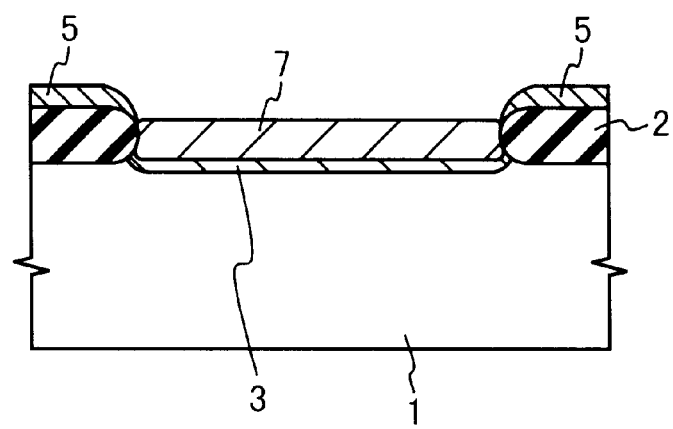
Figure 4C:
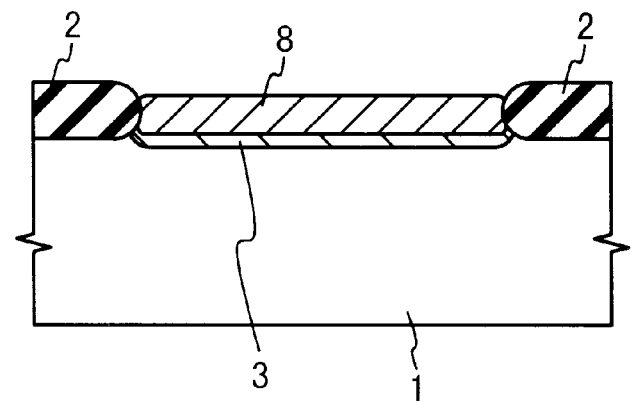
Figure 5:
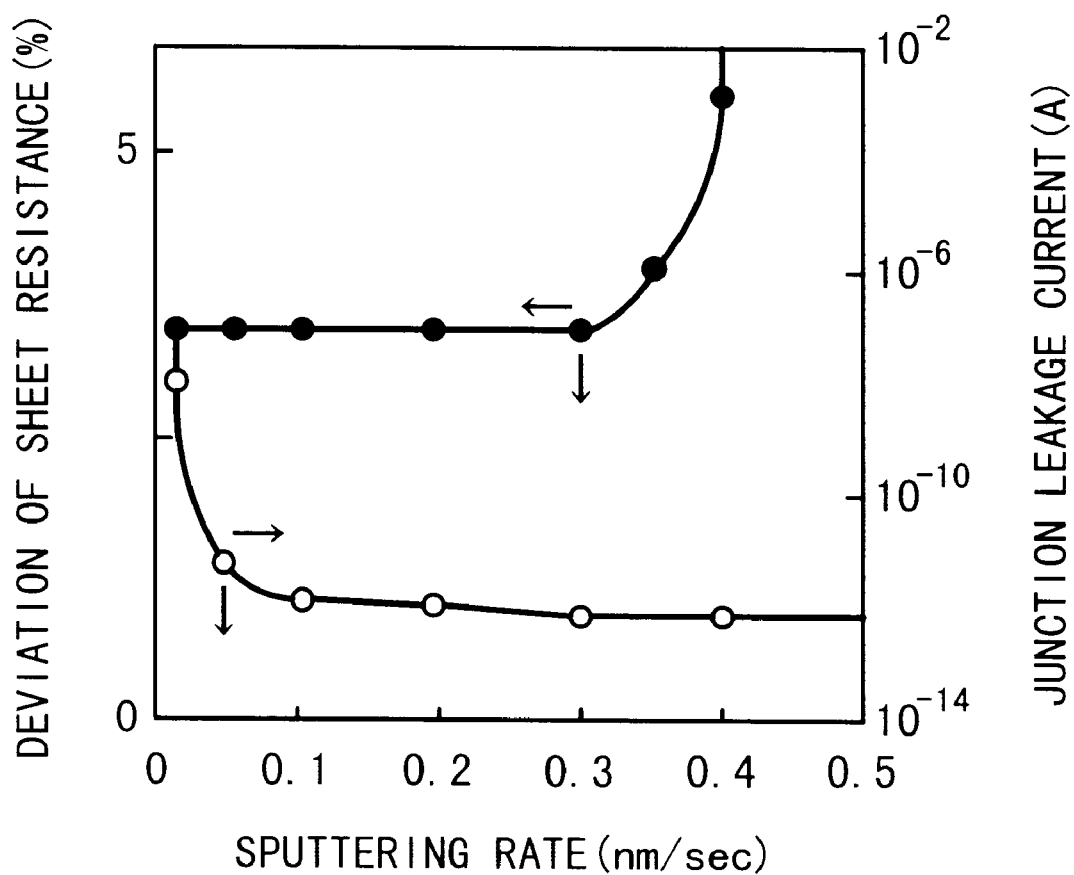
FIG. 5 is a graph to explain a relation of deviation of sheet resistance and junction leakage current to sputtering film formation rate when the silicide layer is formed in the method of forming the silicide layer according to the second embodiment of the present invention.

Next, the method of forming a silicide layer according to the second embodiment of the present invention will be described below in detail with reference to FIGS. 4A to 4C and FIG. 5. FIGS. 4A to 4C show another manufacturing process when the cobalt silicide layer is formed. FIG. 5 is a graph of the experiment result to specify a cobalt film forming condition in the case. In the following explanation, the same components as in the first embodiment are indicated by the same reference numerals.

As described in the first embodiment, the element separation insulating film 2 is selectively formed on the surface of the P-type the silicon substrate 1. The diffusion layer 3 is formed on the surface of the silicon substrate 1 in the area where the element separation insulating film 2 is not formed. The diffusion layer 3 is an N-type diffusion layer.

Next, the cobalt film 5 is formed on the surface of the silicon substrate 1 by the sputtering method to have the film thickness of 10 nm in a sputtering apparatus. The sputtering apparatus can be set to the high vacuum of about $10^{-9}$ Torr.

The film formation by sputtering is performed at the high temperature of about 400° C.

What is important in the film formation by the sputtering method is that the film forming rate of the cobalt film, i.e., the sputtering film formation rate is set to be smaller than the silicidation rate into the $Co_2Si$ film. In this case, all the cobalt atoms which reach the surface of the diffusion layer 3 in the sputtering film formation process perform heat reaction with the silicon atoms on the surface of the diffusion layer 3. That is, the $Co_2Si$ film 6 is formed at the same time as the sputtering film formation process is performed. Also, the cobalt film 5 is deposited on the element separation insulating film 2 as the insulating film just as it is, in the sputtering film formation process. The $Co_2Si$ film 6 is selectively grown on the surface of the diffusion layer 3. The $Co_2Si$ film 6 is set to have the film thickness of about 14 nm. It should be noted that the sputtering film formation rate in this case becomes smaller than that in the first embodiment.

In the method of the second embodiment, it is necessary to set the sputtering film formation rate to an appropriate value. This will be described with reference to FIG. 5.

In FIG. 5, the horizontal axis is sputtering film formation rate, the left vertical axis is deviation of sheet resistance in the final $CoSi_2$ film, and the right vertical axis is junction leakage current in the cobalt silicide diffusion layer.

As seen from FIG. 5, the deviation of the sheet resistance in the wafer is 3% which is substantially constant when the sputtering film formation rate is 0.3 nm/sec or below. On the other hand, the deviation increases rapidly when the sputtering film formation rate is more than 0.3 nm/sec.

However, when the sputtering film formation rate becomes small, the junction leakage current of the diffusion layer increases gradually. When the sputtering film formation rate becomes smaller than 0.05 nm/sec., the junction leakage current of the diffusion layer increases rapidly. This is because the processing time becomes long when the sputtering film formation rate becomes too small, so that a large quantity of cobalt atoms of the cobalt film 5 on the element separation insulating film 2 enter the diffusion layer 3, as shown in FIG. 5. At this time, over-silicidation progresses at the end of the element separation insulating film 2 so that the junction plane is degraded. As described above, the sputtering film formation rate of cobalt in the second embodiment is 0.05 nm/sec or above, and it should be set to 3 nm/sec or below.

Next, as described in the first embodiment, the first sintering is performed in the nitrogen ambience. In this way, as shown in FIG. 4B, the phase transition of the $Co_2Si$ film 6 on the diffusion layer 3 into a CoSi film 7 is performed. In this case, the cobalt film 5 remains on the element separation insulating film 2. It should be noted that the surface of the cobalt film 5 may be a little oxidized.

Next, the silicon substrate 1 is soaked in the mixture solution of a sulfuric acid solution and a hydrogen peroxide solution for a predetermined time such that the cobalt film 5 on the element separation insulating film 2 is selectively removed by the etching.

Next, the second sintering is performed. The condition of the second sintering is the temperature of 800° C. and the processing time is set to about 10 sec. As shown in FIG. 4C, the phase transition of the CoSi film 7 on the diffusion layer 3 into a $CoSi_2$ film 8 is performed.

In this way, the $CoSi_2$ film 8 is selectively formed on the surface on the diffusion layer 3 on the silicon substrate 1 finally. No $CoSi_2$ film 8 is formed on the element separation insulating film 2.

In case of the second embodiment, the whole of cobalt film of the film surface to be silicided is changed into the cobalt silicide layer. Therefore, the film thickness control of the cobalt silicide layer becomes very easy. The deviation of sheet resistance of the gate electrode and the source and drain diffusion layer in the MOS transistor in the semiconductor wafer can be easily reduced so that the deviation of characteristic of the MOS transistors can be reduced.

Next, the silicide forming method according to the third embodiment of the present invention will be described with reference to FIGS. 6A to 6D and FIGS. 7A and 7B. FIGS. 6A to 6D show the manufacturing process when a salicide layer is formed in a CMOS transistor. Also, FIGS. 7A and 7B are graphs of sheet resistance of the diffusion layer to explain the effect when the silicide layer is formed by the method of the present invention.

Figure 6A:
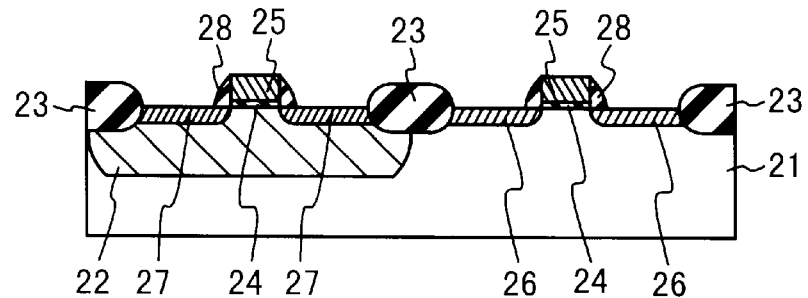
FIGS. 6A to 6D are cross sectional views of a MOS transistor with a silicide layer in a method of forming the silicide layer according to a third embodiment of the present invention in the forming process order.
Figure 7A:
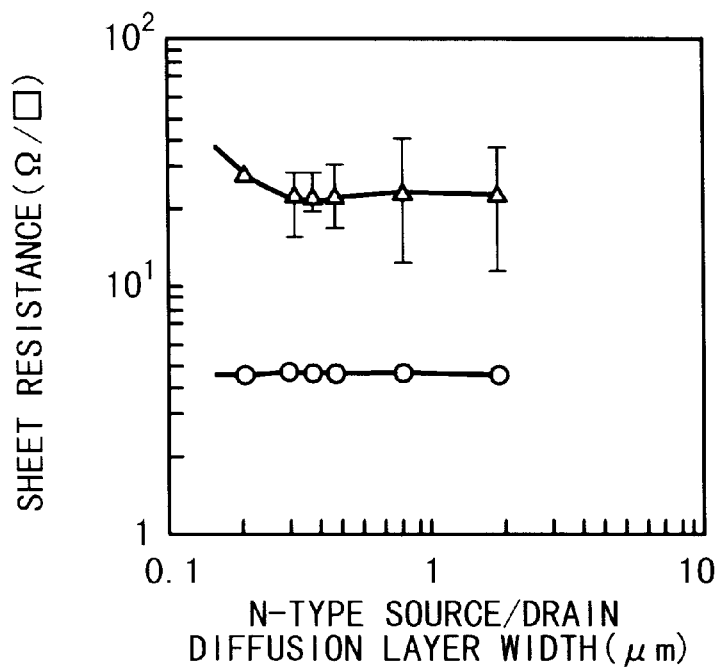
FIGS. 7A and 7B are graphs to explain an effect of the above third embodiment.
Figure 7B:
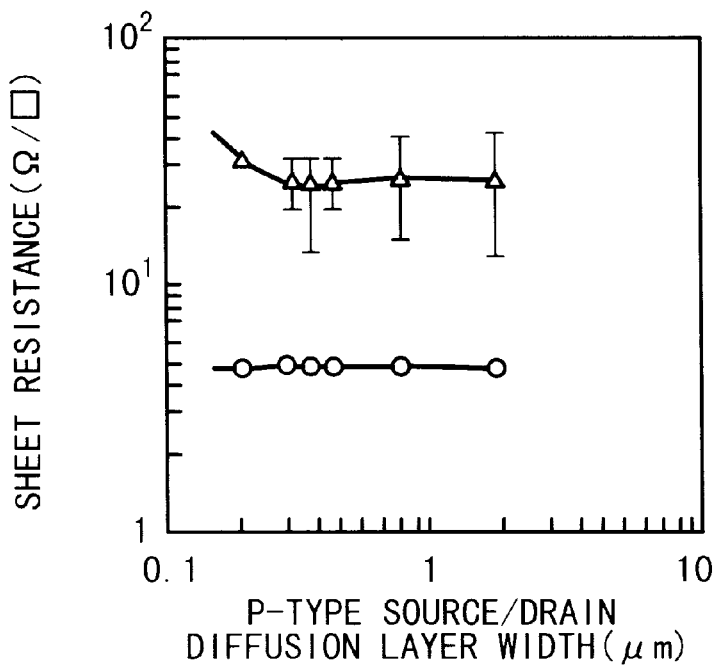

As shown in FIG. 6A, an N well 22 is formed by the ion implantation and the heat treatment in a region where a P channel MOS transistor is formed on a P-type silicon substrate 1. Subsequently, element separation insulating films 23 are formed on the surface of the silicon substrate 1 to have the film thickness of about 350 nm. Then, gate oxide films 24 are formed in the active regions which are surrounded by element separation insulating films 23 to have the film thickness of 10 nm. Then, a polysilicon as the gate electrode material is grown to have the film thickness of 150 nm. In this case, the polysilicon film contains phosphorus ion impurities in a high concentration.

Next, the above-mentioned polysilicon film is patterned by a well known photolithography technique and the ion implantation technique to form the gate electrodes 25. N-type diffusion layers 26 with a low concentration and P-type diffusion layers 27 with a low concentration are formed in order by the ion implantation technique. Subsequently, the silicon oxide film is deposited on the whole surface to have the film thickness of 70 nm. Then, side wall spacers 28 are formed on the side surfaces of the gate electrodes 25 by an etching back method using an anisotropic dry etching.

Figure 6B:
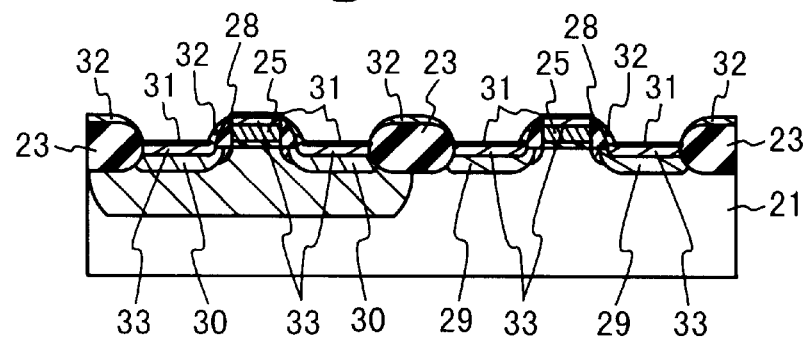

Next, as shown in FIG. 6B, P-type diffusion layers with a high concentration and N-type diffusion layers with a high concentration are formed by the photolithography technique and the ion implantation technique. In this way, the N-type source and drain diffusion layers 29 and P-type source and drain diffusion layers 30 are formed to accomplish LDD structures.

Next, native oxide films on the surface of the gate electrodes 25 composed of polysilicon and the surfaces of the silicon substrate 21 are removed by the etching with a diluted fluoric acid solution.

Subsequently, as in the first embodiment, a barrier film 31 is formed on the N-type source and drain diffusion layers 29, the P-type source and drain diffusion layers 30 and the surfaces of the gate electrodes 25.

Next, in the same way as in the first embodiment, a cobalt film 32 is formed by the sputtering in the multi-chamber apparatus. In this case, the sputtering film formation is performed at the high temperature of about 450° C. The film thickness of the cobalt film 32 is set to about 15 nm. The silicon substrate 21 is transferred to another chamber of the above-mentioned multi-chamber apparatus in the same vacuum state and the heat treatment is performed in the high vacuum state of about $10^{-9}$ Torr. In this case, the heat treatment temperature is set to about 450° C. and the heat treatment time is about 30 sec. Through the heat treatment, the cobalt atoms of the cobalt film 32 diffuse to the surfaces of the N-type source and drain diffusion layers 29, the surfaces of the P-type source and drain diffusion layers 30 and the surfaces of the gate electrodes 25 via the barrier film 31 to form the $Co_2Si$ film 33 on these surfaces.

Next, the silicon substrate 21 is soaked in the mixture solution of a sulfuric acid solution and a hydrogen peroxide solution to selectively remove the cobalt film 32 on the element separation insulating films 23 and the side wall spacers 28 by the wet etching. In this way, the $Co_2Si$ film 33 is remained only on the surfaces of the N-type source and drain diffusion layers 29, the surfaces of the P-type source and drain diffusion layers 30 and the surfaces of the gate electrodes 25. In this case, there is no $Co_2Si$ film on the element separation insulating films 23 as insulating films and the side wall spacers 28.

Figure 6C:
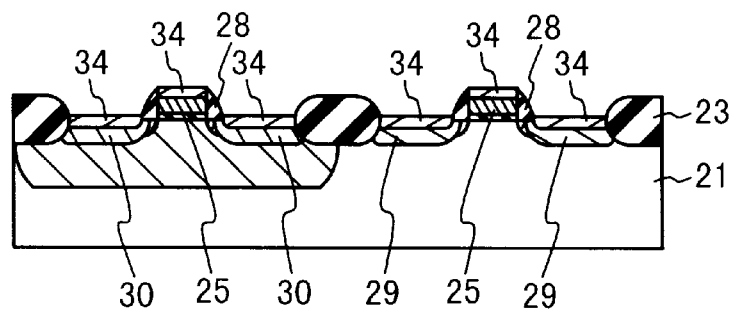

Next, the rinse process is performed. Then, as in the first embodiment, the first sintering process is performed in the nitrogen ambience. As a result, as shown in FIG. 6C, the phase transition from the $Co_2Si$ film 33 into the CoSi film 34 is performed. In this way, the CoSi films 34 are formed on the surfaces of the N-type source and drain diffusion layer 29, the surfaces of the P-type source and drain diffusion layer 30 and the surfaces of the gate electrodes 25.

Figure 6D:
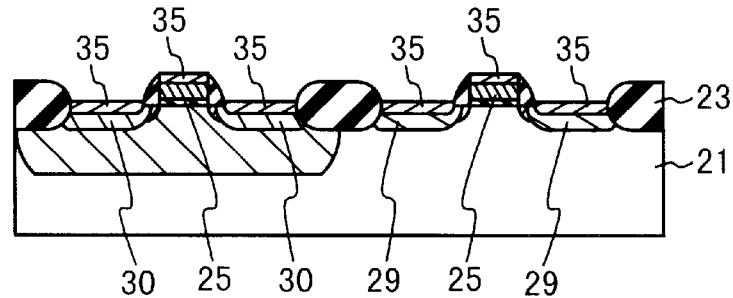

Next, as described in the first embodiment, the second sintering process is performed. In this case, the second sintering is performed at the temperature of 800° C. for the processing time of about 10 sec. As shown in FIG. 6D, the CoSi film 34 is phase-transited into the $CoSi_2$ film 35 in turn.

In this way, the $CoSi_2$ films are finally selectively formed on the surfaces of the N-type source and drain diffusion layer 29, the surfaces of the P-type source and drain diffusion layer 30 and the surfaces of the gate electrode 25 in the CMOS transistor. That is, the salicidation using the cobalt silicide is performed in the MOS transistor.

The low sheet resistance values are obtained in the N-type source and drain diffusion layers and P-type source and drain diffusion layers which have the pattern width equal to or less than 0.5 μm, and the gate electrodes of having the pattern width of 0.2 μm with the $CoSi_2$ film which has been formed through the salicidation in the above-mentioned CMOS transistor.

The experiment results accomplished by the present invention will be described with reference to FIGS. 7A and 7B.

FIG. 7A shows the N-type source and drain diffusion layer pattern width dependency of the sheet resistance of the cobalt silicide layer which is formed by the manufacturing method of the present invention, and FIG. 7B shows the P-type source and drain diffusion layer pattern width dependency of the sheet resistance of the cobalt silicide layer which is formed by the manufacturing method of the present invention. In FIGS. 7A and 7B, the horizontal axis indicates source and drain diffusion layer width and the vertical axis indicates sheet resistance of the finally silicided source and drain diffusion layer in the wafer. In FIGS. 7A and 7B, a Δ mark indicates a sheet resistance value when a cobalt silicide layer is formed by the method in the first conventional example, and a ○ mark indicates a sheet resistance value when the silicide layer is formed by the method in the third embodiment.

As seen from FIGS. 7A and 7B, in the conventional example, when the source and drain diffusion layer width becomes equal to or less than 0.3 μm, the sheet resistance value increases gradually. Also, the deviation of about 70% of sheet resistance values gets to occur in the wafer.

On the other hand, in the method of the present invention, the absolute value of the sheet resistance value reduces greatly. Also, the source and drain diffusion layer width dependency of sheet resistance value disappears and the sheet resistance value is substantially constant until the source and drain diffusion layer width becomes about 0.1 μm. The deviation of sheet resistance values in the wafer is equal to or less than 3%.

The above effect can be obtained regardless of whether the source and drain diffusion layer in the MOS transistor is the N-type diffusion layer or the P-type diffusion layer. Also, the sheet resistance value of the gate electrode after the silicidation has the same effect as described above.

In the above-mentioned embodiments, the case that the silicon substrate is the P-type is described. However, the present invention is not limited to this but can be applied to the N-type silicon substrate. In the case, the P-type and the N-type should be replaced in the description.

Also, in the third embodiment, when the cobalt silicide layer is formed, the method described in the second embodiment may be used. Or, the method described in the first embodiment and the method described in the second embodiment may be used together.

Also, in the method of the present invention, nickel may use instead of cobalt. In the case, the final silicide layer is composed of NiSi film.

As described to above, according to the method of manufacturing the semiconductor device of the present invention, a high melting point (refractory) metal silicide layer can be selectively formed in predetermined area on the semiconductor substrate. Therefore, while the semiconductor substrate is heated, the high melting point metal film is formed and the high melting point metal silicide layer having the first phase structure is formed. Through the heat treatment, the high melting point metal silicide layer having the first phase structure is changed into the high melting point metal silicide layer having the second phase structure and the high melting point metal silicide layer having the second aspect structure is changed into the high melting point metal silicide layer having the third aspect structure. In this case, the barrier film composed of the porous silicon oxide film is formed between the high melting point metal silicide layer and the above-mentioned high melting point metal film.

Instead, while the semiconductor substrate is heated, the high melting point metal is deposited on the semiconductor substrate surface. At the same time, the deposited high melting point metal is changed into the high melting point metal silicide layer having the first phase structure through the heat reaction. In this case, the film forming rate of the high melting point metal film is set to be smaller than the phase transition rate in which the high melting point metal silicide layer having the first phase structure is formed. Then, the heat treatment is performed such that the above-mentioned high melting point metal silicide layer having first phase structure is changed into the high melting point metal silicide layer having the second phase structure or the third phase structure. Thus, the high melting point metal silicide layer having the third phase structure can be epitaxially grown.

The resistance of the source and drain diffusion layer or gate electrode in the MOS transistor reduces greatly. Also, the resistance value of the final cobalt silicide layer does not have the pattern size dependency to allow the design of the MOS transistor or the semiconductor device to be very easy performed.

Also, the high melting point metal film is phase-transited into the high melting point metal silicide layer having the first phase structure which is composed of the $Co_2Si$ film.

For this reason, the film thickness of the final high melting point metal silicide layer having the final third phase structure which is composed of the $CoSi_2$ film depends on the film thickness of the high melting point metal film in the film forming process of the high melting point metal film just as it is. Therefore, the film thickness control of the high melting point metal silicide layer becomes very easy. Also, the deviation of sheet resistance values of the gate electrode and source and drain diffusion layers in the MOS transistor in the semiconductor chip or the semiconductor wafer can be reduced easily.

According to the present invention, the forming process of the silicide layer can be simplified and be made stable, resulting in reduction of the manufacturing cost. Even if the size of the silicided area is made very small to be about 0.1 $\mu$m, the silicide layer of the high quality can be formed. As a result, the high integration, high speed processing and high functioning of the semiconductor device can be accomplished.

What is claimed is:

1. A method of manufacturing a semiconductor device, comprising:
   depositing a refractory metal on a barrier film;
   forming a refractory metal silicide layer having a first phase structure; and
   performing heat treatment to change said first refractory metal silicide layer having said first phase structure into a refractory metal silicide layer having a second phase structure.

2. A method according to claim 1, wherein said forming a refractory metal silicide layer having a first phase structure includes forming said refractory metal silicide layer having said first phase structure during performing a deposition operation of a refractory metal, in a state in which a semiconductor substrate is heated.

3. A method according to claim 2, wherein a deposition rate of said refractory metal is smaller than a phase transition rate of said refractory metal into a refractory metal silicide.

4. A method according to claim 3, wherein said deposition rate of said refractory metal is in a range of 0.05 nm/sec. to 0.3 nm/sec.

5. A method according to claim 1, wherein said forming a refractory metal silicide layer having a first phase structure includes:
   depositing a refractory metal film in a vacuum state; and
   heating a semiconductor substrate in the vacuum state to change said refractory metal film into said refractory metal silicide layer having a first phase structure.

6. A method according to claim 1, wherein said forming a refractory metal silicide layer having a first phase structure includes:
   forming a barrier film on a silicon containing layer of a semiconductor substrate, said barrier film functioning to allow atoms of a refractory metal to pass through said barrier film and to inhibit silicon atoms in said silicon containing layer from passing through said barrier film; and
   heating said semiconductor substrate to form said refractory metal silicide layer having said first phase structure from said atoms of said refractory metal deposited on said barrier film and said silicon atoms in said silicon containing layer.

7. A method according to claim 6, wherein said barrier film is a porous silicon oxide film.

8. A method according to claim 6, wherein said refractory metal is deposited on said barrier film while said semiconductor substrate is heated to a temperature in a range of 400 to 500° C.

9. A method according to claim 1, further comprising the step of rinsing a semiconductor substrate to remove a non-silicided portion of a refractory metal.

10. A method according to claim 9, wherein said rinsing step includes rising said semiconductor substrate with a mixture solution of a sulfuric acid solution and a hydrogen peroxide solution to remove the non-silicided portion of the refractory metal.

11. A method according to claim 1, wherein said performing heat treatment includes:
    performing the heat treatment such that said refractory metal silicide layer having said first phase structure is changed into a refractory metal silicide layer having a third phase structure, and then said refractory metal silicide layer having said third phase structure is changed into a refractory metal silicide layer having said second phase structure.

12. A method according to claim 11, wherein said refractory metal is one of cobalt or nickel.

13. A method according to claim 11, wherein said refractory metal silicide layer having said first phase structure is a $Co_2Si$ film, said refractory metal silicide layer having said third phase structure is a $CoSi$ film, and said refractory metal silicide layer having said second phase structure is a $CoSi_2$ film.

14. A method according to claim 13, wherein said $CoSi_2$ film as said refractory metal silicide layer having said second phase structure is epitaxially grown.

15. A method of manufacturing a semiconductor device, comprising:
    depositing a refractory metal on a barrier film in a state in which a semiconductor substrate is heated;
    forming said refractory metal silicide layer having said first phase structure during performing the deposition operation;
    controlling a quantity of said refractory metal to be deposited such that said refractory metal silicide layer having said first phase structure has a predetermined film thickness; and
    performing heat treatment to change said refractory metal silicide layer having said first phase structure into a refractory metal silicide layer having a second phase structure.

16. A method according to claim 15, wherein a deposition rate of said refractory metal is smaller than a phase transition rate of said refractory metal into a refractory metal silicide.

17. A method according to claim 16, wherein said deposition rate of said refractory metal is in a range of 0.05 nm/sec. to 0.3 nm/sec.

18. A method of manufacturing a semiconductor device, comprising the steps of:
    forming a barrier film on a silicon containing layer of a semiconductor substrate, said barrier film functioning to allow atoms of a refractory metal to pass through said barrier film and to inhibit silicon atoms in said silicon containing layer from passing through said barrier film;
    heating said semiconductor substrate to form said refractory metal silicide layer having said first phase structure from said atoms of said refractory metal deposited on said barrier film and said silicon atoms in said silicon containing layer;
    rinsing said semiconductor substrate to remove a non-silicided portion of said refractory metal; and
    performing heat treatment to change said refractory metal silicide layer having said first phase structure into a refractory metal silicide layer having a second phase structure.

19. A method according to claim 18, wherein said performing heat treatment includes:

performing a first heat treatment such that said refractory metal silicide layer having said first phase structure is changed into a refractory metal silicide layer having a third phase structure, and then said refractory metal silicide layer having said third phase structure is changed into a refractory metal silicide layer having said second phase structure.

20. A method according to claim 19, wherein said refractory metal is one of cobalt or nickel.

21. A method according to claim 19, wherein said refractory metal silicide layer having said first phase structure is a $Co_2Si$ film, said refractory metal silicide layer having said third phase structure is a $CoSi$ film, and said refractory metal silicide layer having said second phase structure is a $CoSi_2$ film.

22. A method according to claim 21, wherein said $CoSi_2$ film as said refractory metal silicide layer having said second phase structure is epitaxially grown.

* * * * *